(12) United States Patent
DiBattista et al.

(10) Patent No.: US 6,825,557 B2
(45) Date of Patent: Nov. 30, 2004

(54) LOCALIZED BACKSIDE CHIP COOLING WITH INTEGRATED SMART VALVES

(75) Inventors: Michael DiBattista, Santa Clara, CA (US); Richard H. Livengood, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 29 days.

(21) Appl. No.: 10/321,339

(22) Filed: Dec. 17, 2002

(65) Prior Publication Data

US 2004/0113265 A1 Jun. 17, 2004

(51) Int. Cl.[7] .............................................. H01L 23/34
(52) U.S. Cl. ...................... 257/712; 257/713; 257/714; 438/106
(58) Field of Search ................................ 257/712, 713, 257/714; 438/106, 122

(56) References Cited

U.S. PATENT DOCUMENTS

| 4,437,510 A | * | 3/1984 | Martorana | .................... 165/32 |
| 4,494,595 A | * | 1/1985 | Schmid | .......................... 165/1 |
| 5,838,351 A | * | 11/1998 | Weber | .......................... 347/85 |
| 6,032,477 A | | 3/2000 | Pfister et al. | |
| 6,054,676 A | | 4/2000 | Wall et al. | |
| 6,094,912 A | | 8/2000 | Williford | |
| 6,250,085 B1 | | 6/2001 | Tousson | |

* cited by examiner

Primary Examiner—Roy Potter
(74) Attorney, Agent, or Firm—Marger Johnson & McCollom, P.C.

(57) ABSTRACT

An integrated circuit device is disclosed. The device comprises a die that has functional units on a first surface and a cooling system arranged adjacent a second surface opposite the first surface. The cooling system comprises a least one microchannel to contain a cooling liquid and to allow flow of the cooling liquid and at least one reservoir arranged adjacent to a region of the die. There is at least one valve between the reservoir and the microchannel to allow the cooling liquid to flow into the reservoir wherein flow of the cooling liquid depends upon a temperature of the die region.

30 Claims, 4 Drawing Sheets

LOCALIZED BACKSIDE CHIP COOLING WITH INTEGRATED SMART VALVES

BACKGROUND

The cooling of integrated circuits is rapidly becoming a performance-related issue. As semiconductor processing technology progresses, for example, a larger number of transistors can fit on ever-shrinking pieces of silicon. These transistors generate heat when they operate, leading to semiconductor devices that get warmer and warmer. At some point, depending upon the materials involved, heat will degrade the performance of the circuitry on the semiconductor chip. Thermal management of the semiconductor chip includes several different approaches, ranging from simple, such as a heat sink that comes in contact with the package, to complex cooling systems with moving parts.

For example, U.S. Pat. No. 6,032,477, issued Mar. 7, 2000, and entitled "Method and Apparatus for Cooling Electrical Components," discloses a sorber and sorbent system. In this system, a sorber chamber contains a sorber fluid that is transported to and from the hot component with electrically controlled valves and removed from the surface of the component using electromagnetic energy.

In another approach, disclosed in U.S. Pat. No. 6,054,676, issued Apr. 25, 2000, and entitled "Method and Apparatus for Cooling and Integrated Circuit," the integrated circuit is inserted into a sealed, thermally insulated chamber. A cooling element inside the chamber is in contact with the integrated circuit package and is operated to cool the package, thereby cooling the integrated circuit.

A more complicated system is disclosed in U.S. Pat. No. 6,094,912, issued Aug. 1, 2000, entitled "Apparatus and Method for Adaptively Controlling Moving Members within a Closed Cycle Thermal Regenerative Machine." The system includes two moving parts, a motor and a power supply to operate the thermal regenerative machine to cool an integrated circuit.

An alternative approach is discussed in U.S. Pat. No. 6,250,085, issued Jun. 26, 2001, and entitled "Temperature Self-Regulated Integrated Circuit and Devices." In this approach, a thermoelectric cooler that operates by running current of an opposite polarity to cool an integrated circuit is integrated into the semiconductor die on which the integrated circuit is manufactured.

BRIEF DESCRIPTION OF THE DRAWINGS

Embodiments of the invention may be best understood by reading the disclosure with reference to the drawings, wherein.

DETAILED DESCRIPTION OF THE EMBODIMENTS

Figure 1:
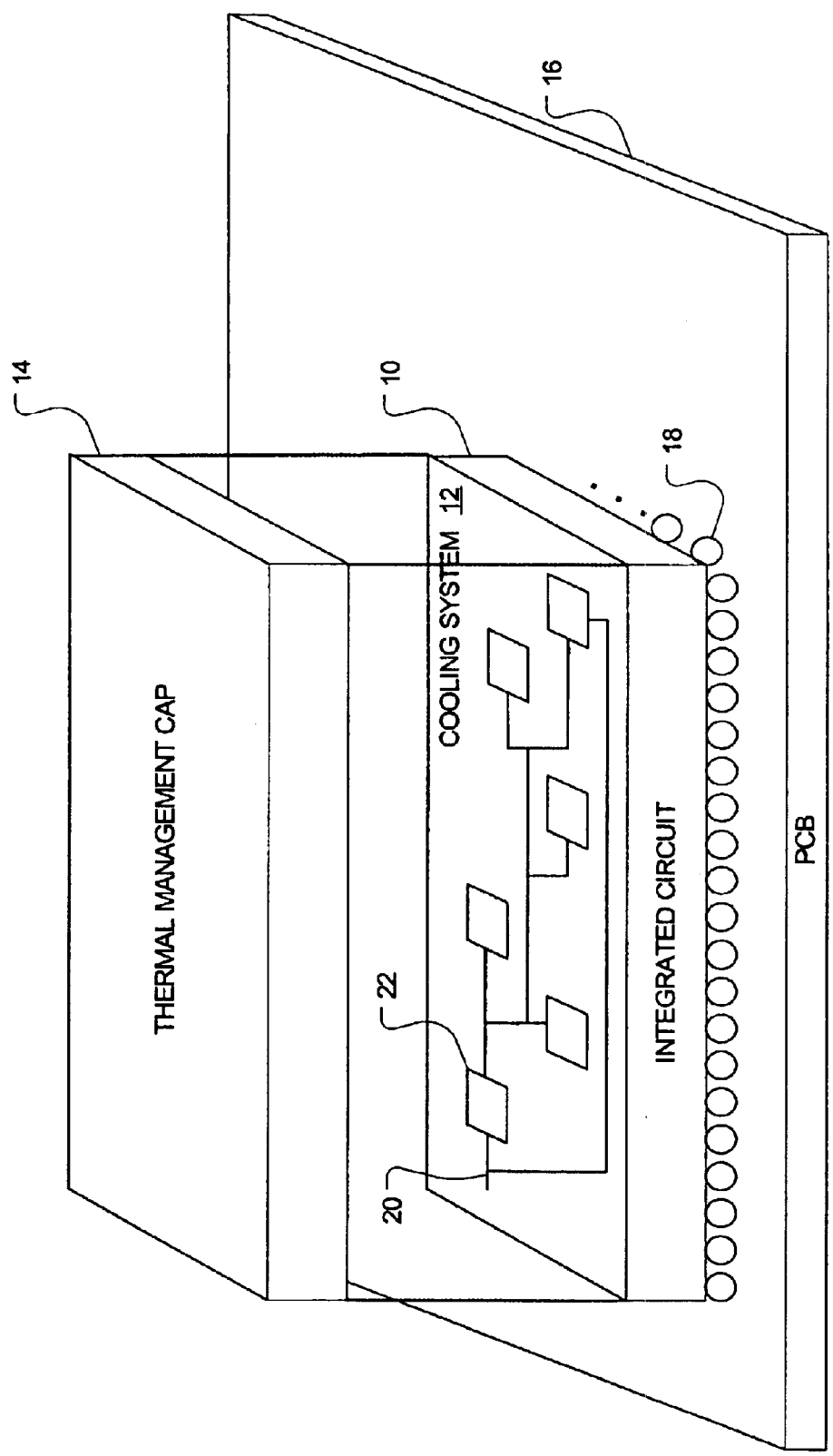
FIG. 1 shows a perspective view of an embodiment of an integrated circuit package having an integrated cooling system.

FIG. 1 shows an embodiment of an integrated circuit and its associated packaging elements, where the integrated circuit die has a cooling system on the side away from the operational circuit components. The integrated circuit die 10 is packaged as a so-call 'flip chip' where the operational circuitry is mounted to the printed circuit board 16 face down. The solder bumps such as 18 make the necessary electrical connections between the operational circuits of the integrated circuit and the traces on the printed circuit board. For purposes of this discussion, the surface of the integrated circuit die 10 having the operational components and coming into contact with the solder bumps such as 18 will be referred to as the first surface.

A cooling system 12 is arranged on a second surface on the opposite side of the integrated circuit from the operational, first side. A thermal management cap 14 also caps the cooling system and is mounted to the second surface of the die to assist in cooling the integrated circuit. As will be seen in more detail, the cooling system comprises at least one reservoir 22 and an arrangement of microchannels 20 to allow a cooling liquid to move around the second surface of the die.

A microchannel, as that term is used here, may consist of a narrow conduit machined or etched into the substrate to act as a transport path for material in gas or liquid phase from the coolant source, such as a pump, to the areas needing cooling. The substrate for many applications of embodiments of this invention may be silicon, but cold also be of any substrate materials such as glass, ceramic, metals or plastics.

The cooling liquid would move around the second surface of the die in response to the operating conditions of the integrated circuit, namely the temperature of various regions of the die. The reservoir or reservoirs would be arranged on the second surface adjacent a region of the die that has functional units on the first surface. Functional units may include such components as microprocessors or digital signal processors, etc., that generate heat during operation. The cooling liquid will flow in the microchannels to cool the warmer regions of the die.

The use of liquids in a cooling system comprised of channels should account for head loss due to friction. This loss is described by the Bernoulli equation:

$$\frac{P_1}{\rho} + \frac{v_1^2}{2} + z_1 g = \frac{P_2}{\rho} + \frac{v_2^2}{2} + z_2 g + h_f g;$$

where $P_1$ and $P_2$ are the pressures at two different points in the channel; $v_1$ and $v_2$ are the fluid velocity in the channels at the two points; $z_1$ and $Z_2$ are the elevations of the two different points in the channel; $\rho$ is the density of the cooling fluid; g is the gravity of the fluid; and $h_f$ is the head loss (friction).

In a simple channel network, the channels are typically of constant diameter and essentially horizontal. For cooling applications, these characteristics are not required but may make the cooling system more manufacturable. Assuming that these characteristics are true, however, it becomes possible to determine the pressure required from an external pumping or pressure source:

$$P_1 - P_2 = \rho g(h_f + h_f(\text{valve})).$$

Essentially, the head loss as a fluid travels in a channel is a combination of two factors. First, the frictional loss due to the length of the channel is the first factor. Second, the number and types of fittings, such as valves, also cause head loss. The position of the valve can be used to control the additional amount of head loss. The characteristic can be used to control the amount of cooling fluid sent to an area of an integrated circuit.

Valves may be constructed from bilayers of temperature sensitive materials having different temperature sensitivities. The stress induced by the difference in the temperature coefficient of expansion of the two materials can cause the valve to actuate without an electronic or pneumatic control system. These valves can be 'programmed' to open and close at specific temperatures depending upon their design. The control of these valves requires no active circuitry, eliminating the need for electrical integration on the backside of the die.

The actuation of the valve is controlled by changing the radius of curvature of the valve due to strain changes in the valve materials. The radius of the curvature is dependent upon Young's Modulus, E, the thickness of the layers, T, and the stress, $S_v$. The radius of curvature can be found as:

$$R = \frac{ET_{top}}{6T_{bot}S_v}.$$

The stress in the valve is based on the strain in the bilayer or multiplayer structure, according to:

$$S_v = \left(\frac{E}{1-v}\right)e,$$

where e is the strain on the material. The strain is calculated from:

$$e=e_0+(a_1-a_2)\Delta T;$$

where $e_0$ is the inherent strain at the interface of the two materials, and the temperature coefficients of expansion of the two materials are represented by $a_1$ and $a_2$. The change in temperature of the system is $\Delta T$.

A single valve will respond in analog fashion to the temperature rise. As the temperature increases in the region where that valve is located, the strain in the bilayer structure will increase, causing the valve to open further and result in a greater volume of fluid flow. As the temperature in the local area decreases the valve will begin to reduce the amount of fluid flow, conserving the fluid and allowing it to be applied in other areas of the die.

Figure 2A:
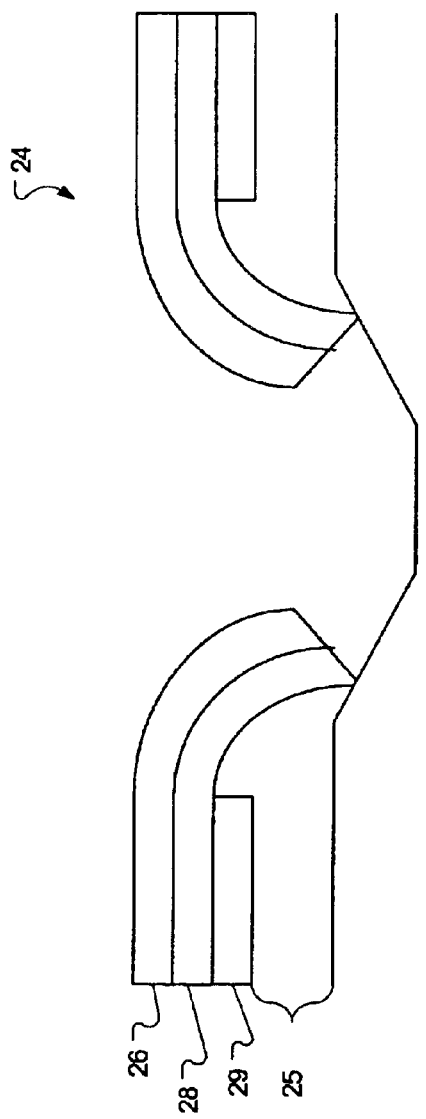
FIGS. 2a and 2b show cross-sections of an embodiment of a temperature-sensitive valve in the closed and open positions, respectively.
Figure 2B:
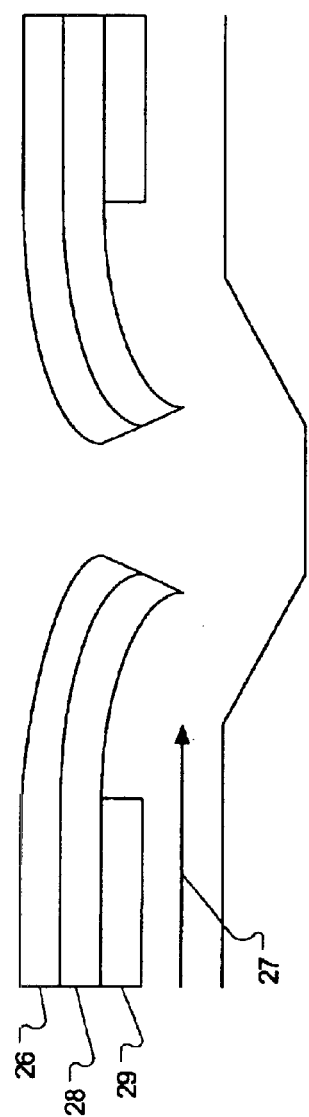

A cross-sectional view of an example valve in its closed and open positions is shown in FIGS. 2a and 2b, respectively. The valve 24 is comprised of at least two layers of materials with different temperature coefficients of expansion. The top layer 26 would typically be comprised of a material with a higher temperature coefficient of expansion and the bottom layer 28 comprised of a material having a lower temperature coefficient of expansion. There is no limitation of which material position is of higher or lower thermal coefficient of expansion, however. During normal conditions, the materials would have a radius of curvature such that the layers of material extending over the base layer 29 curl downwards and block fluid in the channel 25. This will be referred to as being of default curved configuration. Generally, the base layer will be the same material in which the reservoirs are manufactured, for example, silicon.

However, when the local temperature rises, the strain on the interface between the two materials rises and the valve straightens as is shown in FIG. 2b. As the valve opens, fluid would move into the region of the die in the direction of arrow 27. It must be noted that the particular configuration of these valves is that the valves open with rising temperature by straightening. This does not preclude the valves being programmed to react to the rise in temperature by tightening the radius of curvature, or being in what is referred to as the default straight position. However, the discussion here will assume that the valves open by straightening as discussed above.

Having established the principles of operation of the valves, it is now possible to discuss embodiments of cooling systems and their methods of operation using these temperature sensitive valves. An embodiment of a cooling system is shown in FIG. 3.

The cooling system is comprised of at least one valve 30 and at least one reservoir 32. As discussed earlier, the reservoir may be arranged on the back or second surface of the die corresponding to a functional unit on the first surface. This is due to the fact that the region of the die containing the functional unit will be a region in which the temperature would more than likely rise. The cooling system may also include a pump or other pressure source 38 and heat sinks or exchangers 40 and 42. However, as can be seen by the outline of the die 10, shown in dashed lines, these components may not necessarily reside on the same surface as the cooling system. As will be discussed in more detail with regard to FIG. 4, there are several alternate locations for these components.

Figure 3:
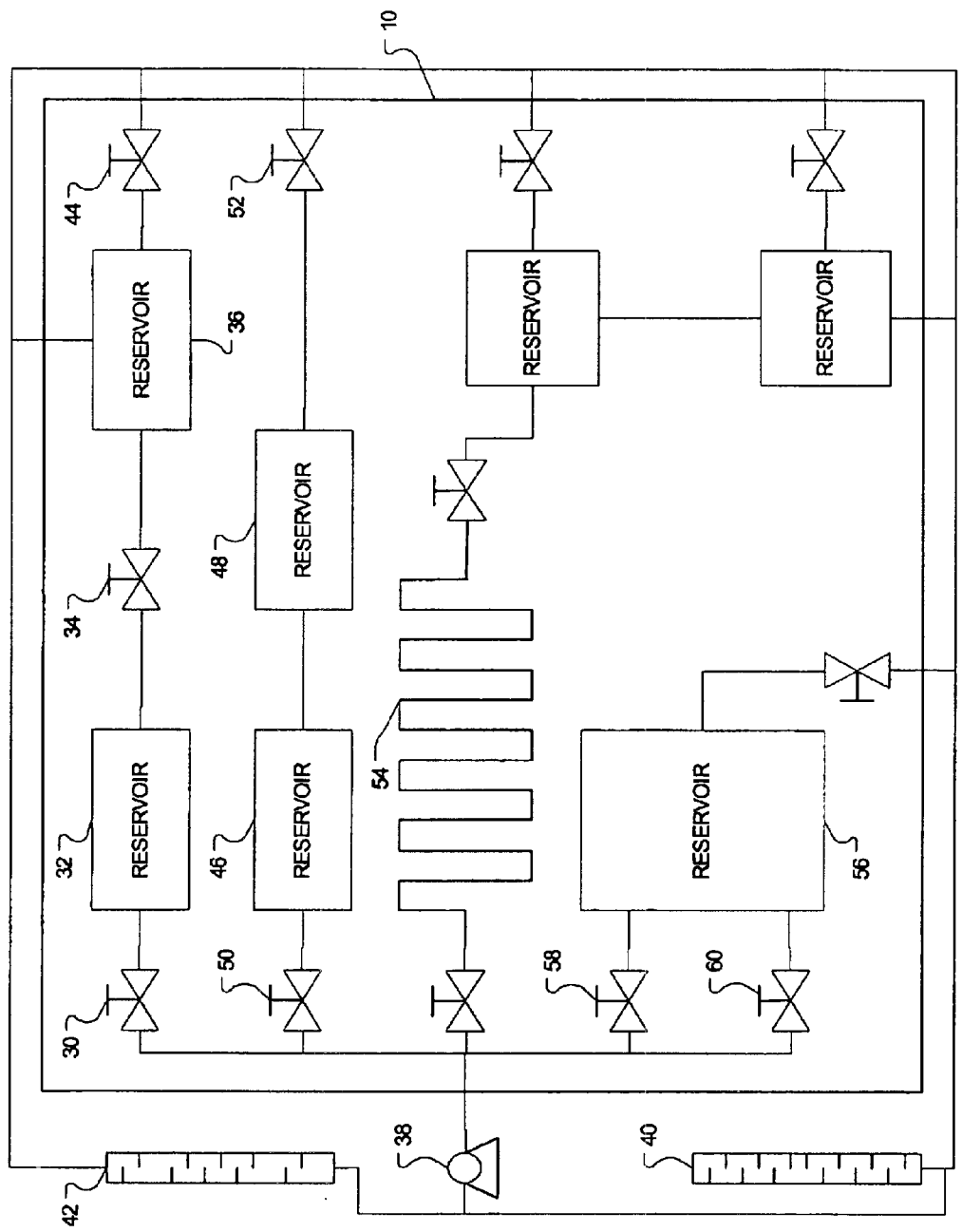
FIG. 3 shows a top view of an embodiment of an integrated cooling system.

As can be seen in FIG. 3, the arrangement of the reservoirs and the valves could be in several different configurations. Each reservoir will typically have an input valve, such as 30, and an output valve such as 34. Notice that reservoirs 32 and 36 are cascaded together. The valve 34 may be programmed to open at a higher temperature than valve 30. This would allow the region to be cooled by reservoir 32 for a first range of temperature, and cooled by both reservoirs 32 and 36. The return path for the fluid could be a direct output, or an output valve 44.

The output valves could be one of several different types. They could be temperature-sensitive valves that operate in an opposite fashion, opening upon a drop in temperature. Alternatively, they could be pressure-sensitive, opening when the fluid pressure reaches a certain point. For example, the amount of fluid pressure caused when the reservoir is nearly overflowing could be the set point of a pressure-sensitive valve. This would allow the reservoir to drain prior to causing any packaging problems from leaking fluids.

Other alternative configurations of valves and reservoirs could also be used. As can be seen by the region 54, the reservoir may not be what would traditionally be called a reservoir, being a depression that can hold fluid. Instead, the microchannels could be arranged as shown at 54. For purposes of this discussion, a reservoir will be defined as any region of the die that is capable of holding a higher volume of liquid than a straight microchannel. Similarly, two reservoirs may be fed by one valve. Reservoirs 46 and 48 are fed by one valve 50 and drained by one output valve 52.

Another possible configuration of valves and reservoirs can be seen with reservoir 56. This reservoir is much larger than other reservoirs on the die and is fed by two valves 58 and 60. The two valves could be of different temperature sensitivities, or could have the same sensitivity, allowing the reservoir to fill faster when the temperature of that region of the die reaches the actuating temperature. The exact configurations of the valves and reservoirs, as well as the configurations of the reservoirs are left up to the system designer.

Figure 4:
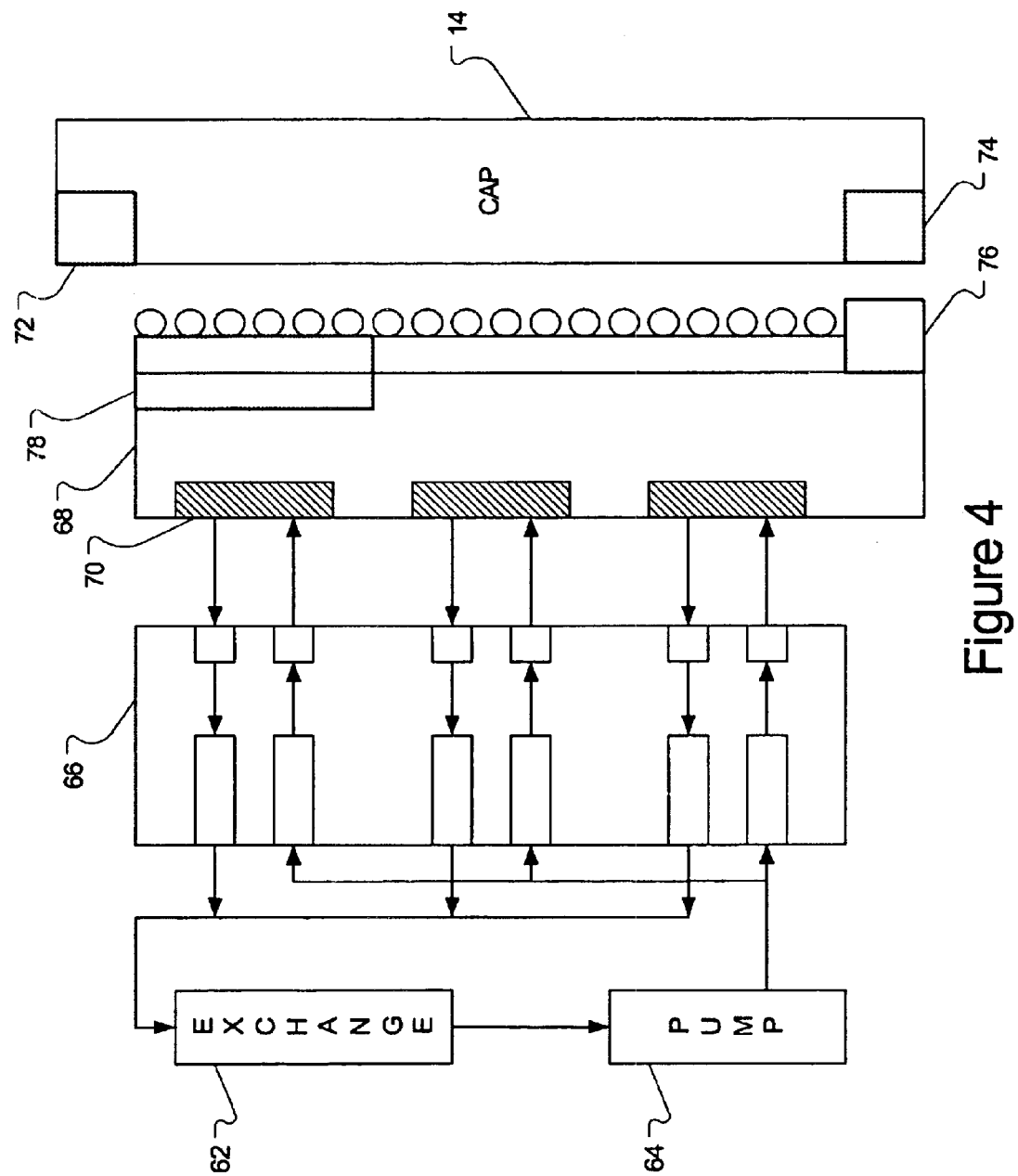
FIG. 4 shows a side view of an integrated circuit package having a cooling system.

FIG. 4 shows a side view of an integrated circuit package. In this view, the integrated circuit die 10 has been sliced up into two pieces 66 and 68. This is for demonstrative purposes only, as the integrated circuit die will typically have the cooling system, shown in slice 66, micromachined on the backside of the die. It is possible that the cooling system is in a separate piece of material, with only the cooling regions or reservoirs 70 on the backside of the die.

The cooling system may also comprise a heat exchanger or other exhaust component 62 and a pump 64. As was discussed earlier, these components may be in several different locations. They could be completely off the die, as is shown by the current positions 62 and 64, such as on the printed circuit board to which the die and package are mounted. Alternatively, they could micromechanical devices manufactured as part of the integrated circuit as shown by possible position 78. They could reside on the operational surface of the integrated circuit, such as at position 76. As yet another alternative, they could be integrated into the thermal management cap 14 at positions 74 and/or 72.

Similarly, the pump component and the heat exchanger, exhaust or sink 64 could be of several different types. For example, the pump component does not have to be a traditional pump, merely a source of pressure. This would include conventional pumps as well as pressured fluid cylinders, etc.

The cooling system and its easy integration into the die provides a simple, relatively inexpensive cooling system with sufficient flexibility for most flip chip manufacturing processes. In addition, the unique structure of the valve provides further flexibility as to the configuration and function of the cooling system.

These 'smart,' temperature sensitive valves may also have other applications. For example, these valves may be integrated into a heat pipe device on the secondary surface for mobile applications. A heat pipe is comprised of three primary components including a capillary structure, a reservoir, and a working fluid. Referring back to FIG. 1, the thermal management cap 14 may serve to 'close' the tops of the microchannels, allowing them to function as a heat pipe.

In some instances, heat pipe systems have a heated region requiring cooling, a fluid, a heat transfer media, a heat sink for cooling and a return path. The heat transfer media is used in or near the heated region and the return path. The heat is absorbed by the fluid and results in a phase change from liquid to gas or saturated vapor. The heat transfer media usually has a surface area to assist in the phase change of the liquid. An example may be the region 54 on FIG. 3. The media can be constructed out of many materials such as silicon.

The equilibrium of the liquid/vapor system is disrupted when the fluid evaporates and results in a mass transfer of the gas to the heat sink due to pressure differences. The heat sink such as 40 and 42 of FIG. 3 causes the fluid to condense back to fluid form. The return path via a capillary structure or based on gravity then allows the fluid to flow back to the heated region. The architecture of such a system would be similar to that shown in FIG. 3, with a slightly different operation.

Heat pipe systems have been applied to mobile computing environments. The temperature sensitive valve could be used to optimized the fluid flow to the capillary structure and improve the cooling efficiency but allowing multiple heat pipes to be implemented or allow heat pipes to be implemented in conjunction with conductive cooling methods such as the fluid reservoirs.

Thus, although there has been described to this point a particular embodiment for a method and apparatus for an integrated cooling system using temperature-sensitive valves, it is not intended that such specific references be considered as limitations upon the scope of this invention except in-so-far as set forth in the following claims.

What is claimed is:

1. An integrated circuit device, comprising:
    a die, having functional units on a first surface;
    a cooling system arranged adjacent a second surface opposite the first surface, the cooling system comprising;
    a least one microchannel to contain a cooling material and to allow flow of the cooling material;
    at least one reservoir arranged adjacent to a region of the die; and
    at least one valve between the reservoir and the microchannel to allow the cooling material to flow into the reservoir wherein flow of the cooling liquid depends upon a temperature of the die region.

2. The device of claim 1, wherein the reservoir further comprises multiple reservoirs arranged uniformly.

3. The device of claim 1, wherein the region of the die further comprises a region of the die on the second surface opposite at least one functional unit arranged on the first surface.

4. The semiconductor device of claim 3, wherein the device further comprises one reservoir for each functional unit.

5. The semiconductor device of claim 1, wherein at least one valve further comprises two valves for each reservoir.

6. The semiconductor device of claim 5, wherein the two valves further comprise an input valve and an output valve.

7. The semiconductor device of claim 1, wherein the cooling material further comprises water.

8. A cooling system, comprising:
    a microchannel to contain a cooling material and to allow flow of the cooling material;
    at least one reservoir arranged adjacent a region of a die;
    at least one temperature-sensitive valve to allow cooling material to flow between the microchannel and the reservoir, wherein flow of the cooling material depends upon a temperature of the die region.

9. The cooling system of claim 8, wherein the cooling system further comprises a pump.

10. The cooling system of claim 8, wherein the cooling system further comprises at least one heat sink.

11. The cooling system of claim 8, wherein at least one reservoir further comprises multiple reservoirs.

12. The cooling system of claim 8, wherein the region of the die is located on a second surface opposite a location of a functional unit on a first surface.

13. The cooling system of claim 8, wherein the temperature-sensitive valve further comprises a structure of at least two different materials.

14. The cooling system of claim 8, wherein the temperature-sensitive valve is arranged in a default curved position.

15. The cooling system of claim 8, wherein the temperature-sensitive valve is arranged in a default straight position.

16. The cooling system of claim 8, wherein the cooling system further comprises at least one pressure-sensitive valve.

17. The cooling system of claim 16, wherein the pressure-sensitive valve is to allow flow of the cooling material from the reservoir to the microchannel and the temperature-sensitive valve is to allow flow from the microchannel to the reservoir.

18. A method of cooling a semiconductor die, the method comprising:

providing at least one microchannel to allow flow of a cooling material;

arranging at least one reservoir to receive the cooling material, wherein the reservoir is arranged adjacent to a die region;

positioning at least one valve to allow cooling material to flow between the reservoir and the microchannel, wherein flow of the cooling material depends upon the temperature of the die region adjacent to the reservoir.

19. The method of claim 18, wherein arranging at least one reservoir further comprises arranging the reservoir is arranged adjacent a die region, wherein the die region is on a second surface opposite a functional unit on a first surface.

20. The method of claim 18, wherein positioning at least one valve further comprises two valves.

21. The method of claim 18, wherein the two valves further comprises an input valve and an output valve.

22. A valve, comprising:

a first layer of a first material having a first temperature coefficient of expansion; and a second layer of a second material disposed on the first layer, wherein the second material has a second temperature coefficient of expansion different from the first temperature coefficient of expansion, such that temperature changes cause the valve to actuate with no control system.

23. The valve of claim 22 further comprising a base layer upon which the first and second layers reside.

24. The valve of claim 22 further comprising a reservoir adjacent the layers, arranged such that the layers overhang the reservoir.

25. The valve of claim 22 wherein the first temperature coefficient of expansion is higher than the second temperature coefficient of expansion.

26. The valve of claim 22 wherein the first temperature coefficient of expansion is lower than the second temperature coefficient of expansion.

27. The valve of claim 22 wherein the valve is in the default curved position.

28. The valve of claim 22 wherein the valve is in the default straight position.

29. A heat pipe system, comprising:

a heat sink;

a heat transfer media to allow a cooling material to flow between the heat sink and a region needing cooling and heated vapor to flow between the region needing cooling and the heat sink; and a temperature-sensitive smart valve to allow control of the flow of the cooling material.

30. The heat pipe system of claim 29, the heat transfer media further comprising microchannels covered with a thermal management cap.

* * * * *